United States Patent
Takei et al.

[11] Patent Number: 5,945,805
[45] Date of Patent: Aug. 31, 1999

[54] CELL EVALUATING METHOD AND CELL EVALUATING APPARATUS

[75] Inventors: Toshitaka Takei; Tamijia Nagai, both of Kanagawa; Kuniharu Suzuki, Tokyo, all of Japan

[73] Assignee: Sony Corporation, Tokyo, Japan

[21] Appl. No.: 08/879,767

[22] Filed: Jun. 20, 1997

[30] Foreign Application Priority Data

Jun. 24, 1996 [JP] Japan .................................. 8-163352

[51] Int. Cl.⁶ .......................... G01N 27/416; H02J 7/00
[52] U.S. Cl. ........................ 320/124; 320/134; 324/434
[58] Field of Search .............................. 320/124, 125, 320/134, 136, 161, 162, 165; 324/434

[56] References Cited

U.S. PATENT DOCUMENTS

| | | | |
|---|---|---|---|
| 4,044,300 | 8/1977 | Dupuis et al. | 324/434 |
| 4,280,097 | 7/1981 | Carey et al. | 324/434 |
| 4,387,332 | 6/1983 | Oyamada et al. | 320/124 |
| 4,937,528 | 6/1990 | Palanisamy | 324/430 |
| 5,705,911 | 1/1998 | Tamai | 320/134 |

*Primary Examiner*—Peter S. Wong
*Assistant Examiner*—Gregory Toatley, Jr.
*Attorney, Agent, or Firm*—Jay H. Maioli

[57] ABSTRACT

A cell evaluating method for evaluating characteristics of a secondary cell which can be repeatedly charged and which includes a step of detecting a cell voltage after a predetermined first charge operation for the cell is started, a step of, if the detected cell voltage is smaller than a reference voltage, proceeding to a second charge operation different from the predetermined first charge operation, and a step of evaluating a state of the cell. Moreover, the cell evaluating method includes a step of carrying out a first cell voltage detection after a first predetermined period of time has passed since a halt of the charge or discharge of a cell, a step of carrying out a second cell voltage detection after a second predetermined period of time has passed, and a step of evaluating, if the difference between the results of the first and second detections is not smaller than a predetermined value, that an internal short circuit occurs in the cell.

16 Claims, 6 Drawing Sheets

FIG. 6

CELL EVALUATING METHOD AND CELL EVALUATING APPARATUS

BACKGROUND OF THE INVENTION

1. Field of the Invention

The present invention relates to a cell evaluating method and a cell evaluating apparatus suitable for use in evaluation of a secondary cell of various kinds such as a lithium ion cell or the like.

2. Description of the Related Art

In the prior art, as the secondary cell a nickel cadmium cell has been widely used, but cells such as the lithium ion cell, a nickel hydrogen cell and so on are newly developed as a cell of high performance and now improvement of those cells will be conducted. In this case, when those secondary cells are developed or improved, there is a need to evaluate characteristics of the cell gained by connecting the cell to the evaluating apparatus.

Further, in a case of the secondary cell the characteristics of which are already known, there is a need to know what state the cell is in as a result of the cell having been used. For example, when a cell is repeatedly used a plurality of times, there is a case in which its capacity capable of being charged decreases. In such a case, in order to know to what extent the capacity of the cell has decreased, it is necessary to evaluate the characteristic such as the chargeable capacity or the like by connecting the cell to the evaluating apparatus.

In a conventional cell evaluating apparatus, the evaluation of the characteristics of the connected secondary cell is made from changes in the cell voltage and the charge and discharge current by practically conducting charging and discharging of the cell, but there is a case that the characteristics of the cell can not be correctly evaluated by simply conducting charging and discharging of the cell.

That is, when a charging is started, for example, there is a need to judge whether or not a cell connected for the evaluation is a so-called short-circuited cell in which the positive and negative electrode sides thereof are short-circuited. It has been customary to judge as the short-circuited cell a cell whose voltage doesn't rise to a reference voltage soon after the charging is started. However, in fact, even a cell judged as the short-circuited cell by this process, there is a cell which can be restored to a normal cell depending on a process since its cell voltage abnormally is lowered due to an excessive discharging or the like. It can not be said that the cell is correctly evaluated.

Moreover, it has been difficult to detect a phenomenon called a micro-short circuit, which is one of the inner-short-circuit states within the above cell, by the conventional evaluating apparatus. That is, a secondary cell becomes a cell in a state of being micro-short circuited because of an intrusion of small extraneous stuff and an occurrence of tree-branch like crystals called a dendrite. With the micro-short circuited cell, a cell voltage once rises to a voltage corresponding to a full charge voltage by an ordinary charge, but if the cell is left as it is, its voltage drops faster than the lowering of a voltage caused by a self-discharge. The lowering of the cell voltage, however, is a phenomenon that takes several days even if it is said that the voltage lowering is faster than the self-discharge. So it has been impossible to detect the micro-short circuited cell by connecting the cell to the conventional evaluating apparatus for merely two or three hours.

In a case of a secondary cell like the lithium ion cell, if the cell is charged to its full charge, a process is carried out by an ordinary charger in which a cell voltage and a charging current are monitored, and when a predetermined voltage and a predetermined current are respectively reached, it is judged that the cell is fully charged, and the charge is stopped. However, it is not necessarily said that the cell is controlled to a correct state of being fully charged though the cell is nearly fully charged by simply judging and controlling the voltage as well as the electric current at a time of charging due to the above reason. So in order for the evaluating apparatus to make the correct evaluation of the characteristics of the cell, the more precise process is demanded.

SUMMARY OF THE INVENTION

In view of these points the present invention has as an object to correctly conduct the evaluation of the cell.

According to a first aspect of the present invention, a cell evaluating method of evaluating characteristics of a secondary cell which can be repeatedly used by charge, includes a step of detecting a cell voltage after a predetermined first charge operation for the cell is started, a step of, if the detected cell voltage is smaller than a reference voltage, proceeding to a second charge operation different from the predetermined first charge operation, and a step of then evaluating a state of the cell.

According to a second aspect of the present invention, a cell evaluating method of evaluating characteristics of a secondary cell which can be repeatedly used by charge, includes a step of carrying out a first cell voltage detection after a first predetermined period of time has passed since a halt of a charge or discharge of a cell, a step of carrying out a second cell voltage detection after a second predetermined period of time has passed, and a step of evaluating, if a difference between the results of the first and second detections is not smaller than a predetermined value, that an internal short circuit occurs in the cell.

According to a third aspect of the present invention, a cell evaluating apparatus of evaluating characteristics of a secondary cell which can be repeatedly used by charge includes means for detecting a cell voltage after a predetermined first charge operation for the cell is started, means for, if the detected cell voltage is smaller than a reference voltage, proceeding to a second charge operation different from the predetermined first charge operation, and means for evaluating a state of the cell.

DESCRIPTION OF THE PREFERRED EMBODIMENTS

A cell evaluating method and a cell evaluating apparatus according to an embodiment of the present invention will hereinafter be described with reference to the accompanying drawings.

Figure 1:
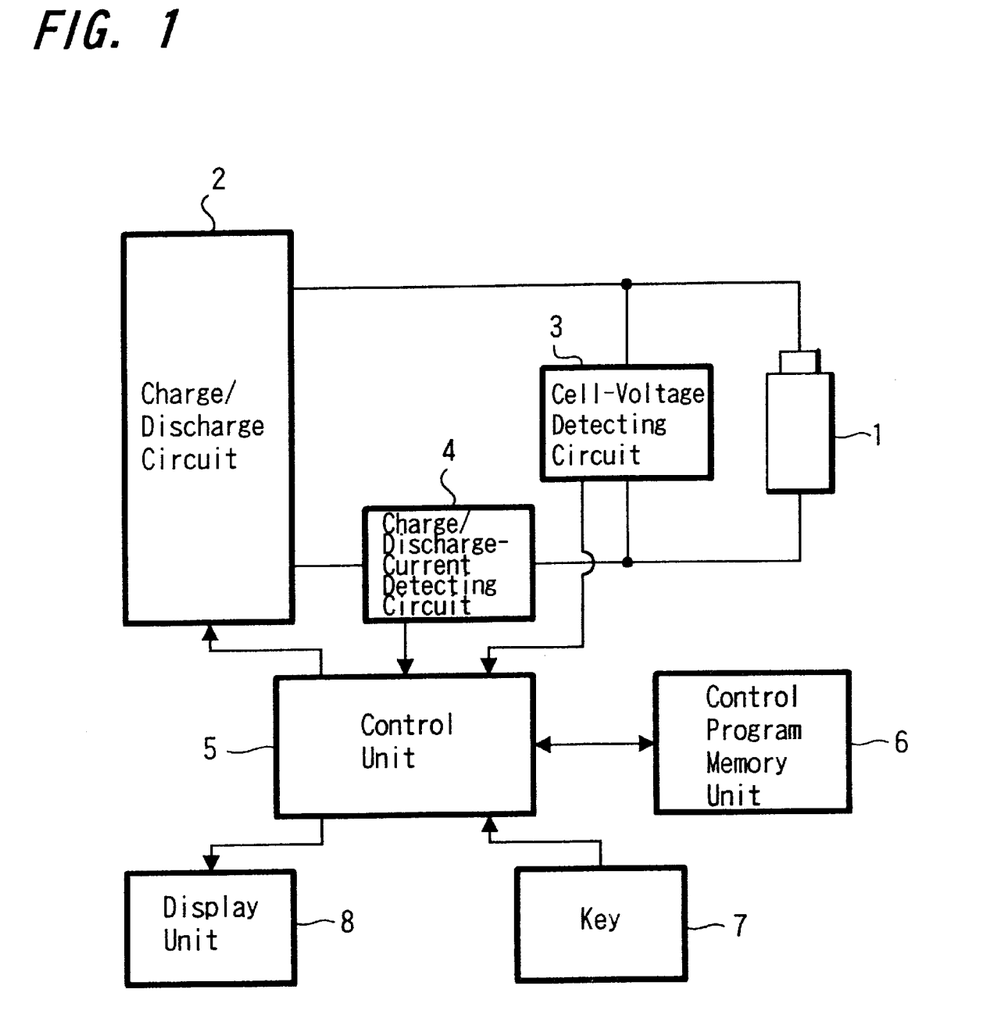
FIG. 1 is a block diagram showing an arrangement of an evaluation apparatus according to one embodiment of the present invention.

FIG. 1 is a block diagram showing a whole constitution of a cell evaluating apparatus according to this example.

An evaluation cell 1 as an object to be measured (a lithium ion cell is used in this example) is loaded on this cell evaluating apparatus and, a charge and discharge circuit 2 is connected to the loaded evaluation cell 1. Based on a control of a control unit 5, which will be described later on, the cell 1 can be charged by the charge and discharge circuit 2 and at the same time a discharge from the cell 1 to the charge and discharge circuit 2 can be carried out. In this case, the charge and discharge circuit 2 of the example is provided with a constant voltage circuit and a constant current circuit and hence it is possible to carry out a constant voltage charge and a constant current charge necessary at a time of charging the secondary cell such as the lithium ion cell or the like. Then, a cell voltage detecting circuit 3 is connected in parallel to the cell 1, and a charge and discharge current detecting circuit 4 is connected to a charge current path (a discharge current path) between the charge and discharge circuit 2 and the cell 1. Then, detected data in each of the detecting circuits 3, 4 is supplied to the control unit 5 which is a system controller of this cell evaluation apparatus.

The control unit 5 is composed of a computer apparatus to which is connected a control program memory unit 6 consisting of a memory device loaded with a predetermined memory medium (a magnetic disk, an optical disk, a magneto-optic disk or the like) or a fixed memory device such as a semiconductor memory and an IC card or the like. And, based on a control program stored in the memory unit 6 the control unit 5 controls the charge and discharge by the charge and discharge circuit 2 while judging a state of detection in the cell voltage detecting circuit 3 and the charge and discharge current detecting circuit 4. In this case, in the control unit 5 there is provided a process unit which carries out a process to set a reference voltage of a voltage value indicated by the control program and a process to compare the set reference voltage with the cell voltage detected in the cell voltage detecting circuit 3, and based on a result of the comparison, the control of the charge and discharge or the like is programmed to be conducted. Moreover, the control unit 5 of this example has a timer function to count passage of time.

Further, to the control unit 5 are connected a key 7 to indicate a start of an evaluation process as well as a display unit 8 to display a result of the evaluation.

Next, by using the evaluation apparatus of this example a process to evaluate the evaluation cell 1 which is the secondary cell (the lithium ion cell) will be described. Each of the processes to be described hereafter is conducted based on the control of the control unit 5 and the control is conducted in accordance with the control program stored in the control program memory unit 6.

Figure 2:
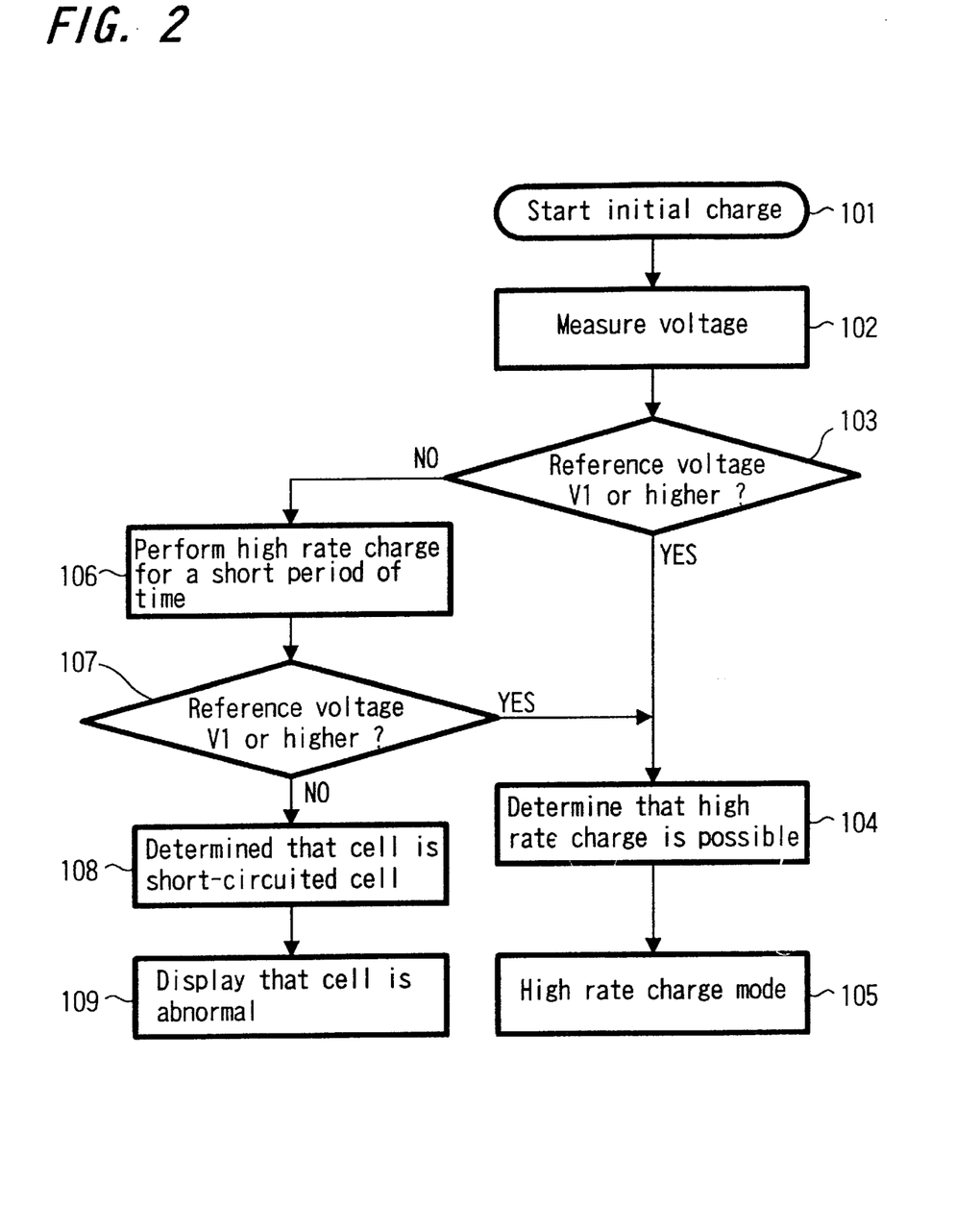
FIG. 2 is a flowchart showing a detecting process of a short circuited cell according to the embodiment.

First, a process to make the evaluation by carrying out a high rate charge of the evaluation cell 1, the high rate charge being to charge the evaluation cell 1 with a comparatively large current C1 (namely, the charge with a current capable of charging a cell up to a rated capacity within about one hour), will be described with reference to a flowchart in FIG. 2. In a case when the high rate charge is carried out, an initial charge process is started (a step 101). In this initial charge process, the charge is conducted with a comparatively small current (for example, a current within a range of 50 mA to 150 mA, preferably about 50 mA) from the charge and discharge circuit 2. After the initial charge is started, a cell voltage is measured by the cell voltage detecting circuit 3 (a step 102). At this time, it is judged whether or not the cell voltage is higher than a reference voltage V1 (a step 103). The reference voltage V1 is set to a voltage value a little higher than a discharge end voltage of, for example, the evaluation cell 1 loaded at the time.

Then, when it is detected that the cell voltage exceeds the reference voltage V1 in the step 103, the control unit 5 judges that it is possible to carry out the high rate charge, and sets the charge and discharge circuit 2 in a high rate charge mode to start the high rate charge (a step 105). The high rate charge mentioned here is to charge with a comparatively large current of nearly C1 (that is, the charge with a charge current capable of charging the cell up to a rated capacity approximately within an hour).

Then, when it is judged in the step 103 that the cell voltage does not exceed the reference voltage v1 after passage of about one hour from the time the initial charge is started in the step 101, the high rate charge of about C1 is conducted for a short time (at least for more than one second, preferably about one minute) (a step 106). Then, it is judged whether or not the cell voltage exceeds the reference voltage V1 by the short time high rate charge (a step 107). Here, when the cell voltage exceeds the reference voltage V1, the process shifts to the step 104 to judge that the cell is one which can be charged at the high rate charge (that is, judges the cell is not at least the short circuited one), and shifts to the high rate charge mode in the step 105.

Then, in a case where the cell voltage does not exceed the reference voltage V1 even by the high rate charge in the step 106, the evaluation cell 1 is judged to be a short circuited one (a step 108). At this time, the charge and so on by the charge and discharge circuit 2 are all stopped, and it is displayed on the display unit 8 that the evaluation cell is an abnormal cell by letters or the like (a short circuited cell)(a step 109).

As set forth above, even when the cell voltage does not reach a predetermined value in the initial charge, it is possible to judge whether or not the evaluation cell is a cell that can be restored to a normal cell by the high rate charge in the short period of time in the step 106 and to judge whether or not the evaluation cell is a cell in a real state of being short-circuited.

Figure 3:
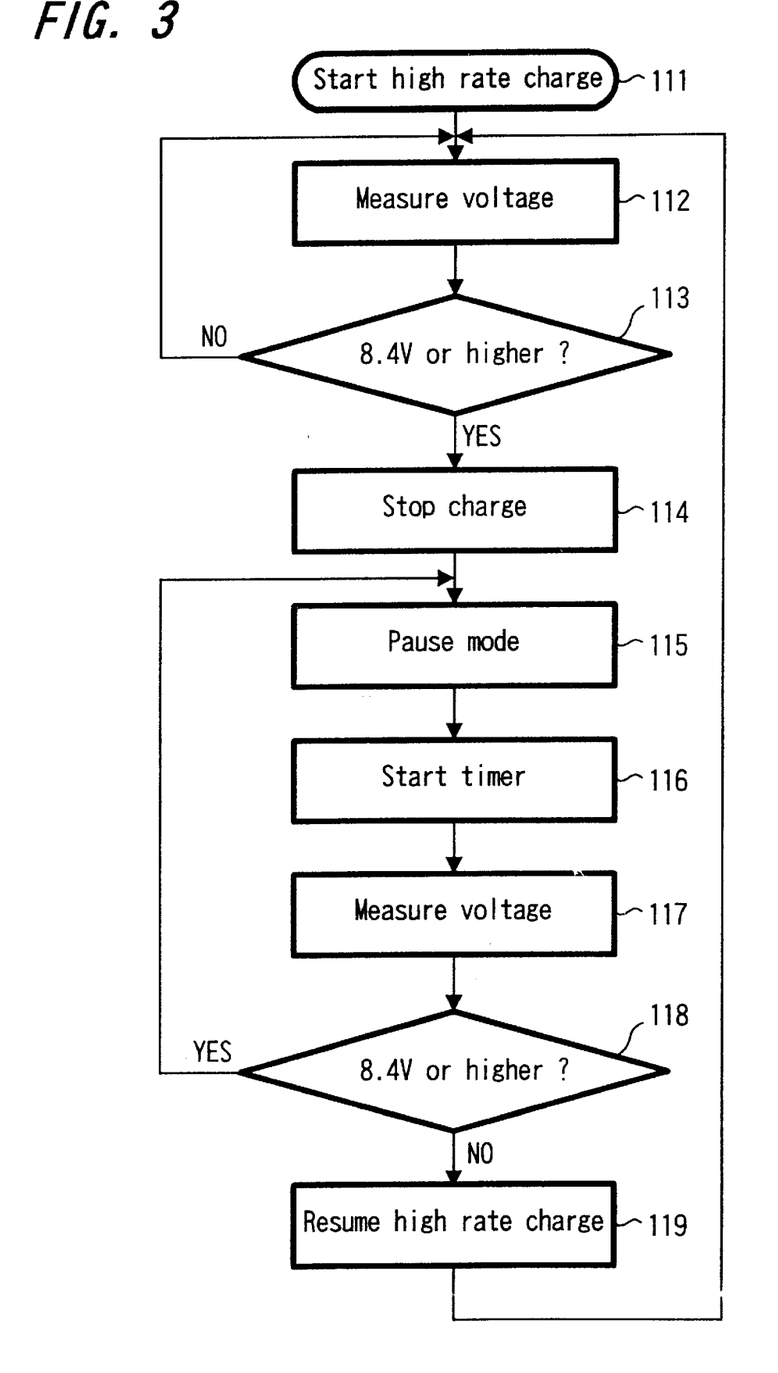
FIG. 3 is a flowchart showing a charging process of a cell until the cell is fully charged.

Next, a process to stop the high rate charge when the high charge mode is in place after the evaluation cell is judged normal by such process will be described with reference to a flowchart in FIG. 3. Here, a lithium ion cell with a cell voltage of 8.4V when fully charged is used as the evaluation cell 1 and at a time of the high rate charge, 8.5V is applied to the cell 1 as a charge voltage from the charge and discharge circuit 2.

First, when a charge is started in the high rate charge mode (a step 111), the cell voltage is measured (a step 112) and whether or not the cell voltage is more than 8.4V is judged (a step 113). In a case where the cell voltage is not more than 8.4V, the measurement in the step 112 and the judgement in the step 113 are repeatedly conducted. Then, when it is judged that the cell voltage is higher than 8.4V according to the step 113, the charge by the charge and discharge circuit 2 is stopped (a step 114) and the process proceeds to a charge pause mode (a step 115). When the charge pause mode is in place, a timer function unit which is prepared in the control unit 5 is started and the process waits for a predetermined time to pass from the charge pause mode being presented by the count of the timer function unit (a step 116). Thereafter, the cell voltage is measured (a step 117). As for the measurement of the cell voltage, it is the measurement in a state of not being supplied with the charge current from the charge and discharge circuit 2, so it is the measurement of an open voltage of the cell 1.

In the measurement of the open voltage of the cell 1 it is judged whether or not the cell voltage is more than 8.4 V (a step 118). Here, if the cell voltage is more than 8.4 V, the process returns to the charge pause mode in the step 115, and the measurement of the cell voltage at every predetermined time by the timer function unit is conducted. Thereafter, if the cell voltage is judged not to be more than 8.4 V in step 118, the high rate charge is resumed (a step 119). After the resumption of the high rate charge, the process returns to the step 112 and the measurement of the cell voltage is conducted while the high rate charge is being continued.

Then, when such a case that the cell voltage is judged more than 8.4 V in the step 118 after the charge pause mode is presented is continued a predetermined number of times (that is, a case where the cell voltage maintains 8.4V continuously), it is judged that the cell 1 is charged up to its full voltage, and the charge process in the high rate charge mode is ended.

Figure 4:
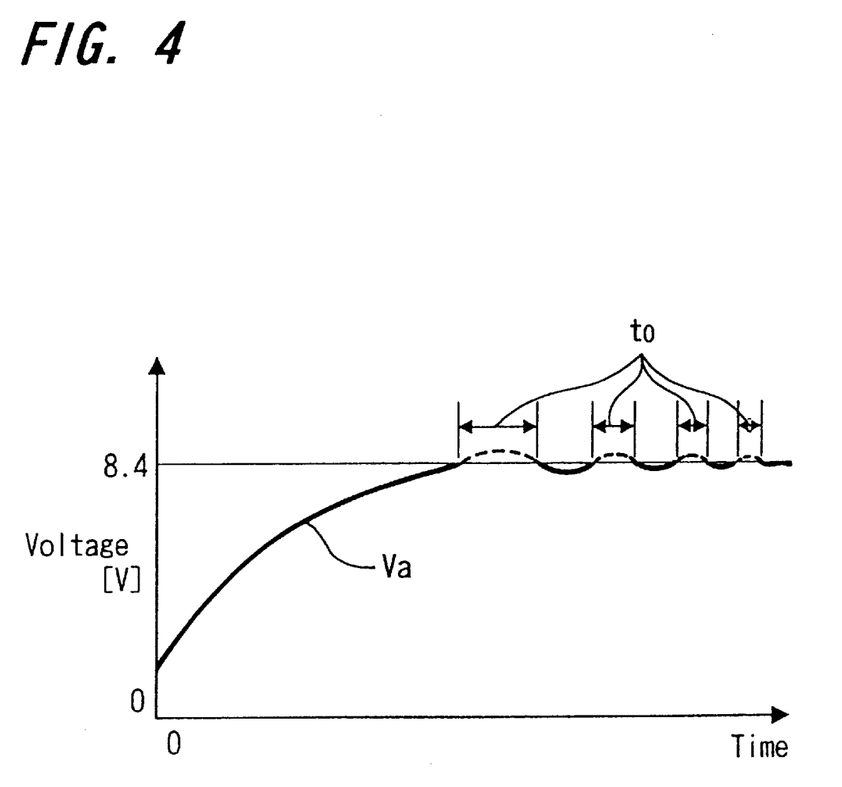
FIG. 4 is a characteristic graph showing an example of a change in the cell voltage until the cell is fully charged according to the embodiment.

In this manner, as the charge process is conducted in the high rate charge mode, the cell 1 is charged until the cell voltage correctly becomes 8.4V which is the voltage at the time of being fully charged, making it possible to charge the evaluation cell 1 correctly up to its full charge by the high rate charge and correctly make an evaluation such as its charge capacity and so on. FIG. 4 is a graph to indicate an example of changes in the cell voltage when the high rate charge is conducted according to the flowchart in FIG. 3. When the high rate charge is started with the charge voltage set as 8.4V and with the charge current set as a current value corresponding to C1, a cell voltage Va rapidly rises high and exceeds the 8.4V. At this time comes a pause period $t_0$ in which supply of the charge current ceases, the cell voltage rises momentarily a little bit higher than the 8.4V. However, if the cell has not reached a state of the cell being fully charged, the cell voltage lowers below 8.4V after passage of a predetermined time. At this time by the process shifting from the step 118 to the step 119 the charge is resumed and the cell is being charged until the cell voltage Va exceeds the 8.4V.

After the cell voltage once reaches the 8.4V with the charge process being conducted in such a manner, the high rate charge for a short period time is intermittently repeated. The cell voltage fluctuates up and down centering around the 8.4V and the charge pause period $t_0$ indicated by a broken line becomes gradually shorter, and the cell is charged up to its full charge finally. Thus the 8.4V which is the cell voltage at the time of the cell being full charge continues.

Next, a process for detecting a micro-short circuit of the evaluation cell 1 will be described with reference to the flowchart in FIG. 5. First, the detection process of a micro-short circuit using the evaluation cell 1 which is, as mentioned above, fully (or up to some capacity)charged, will be described. In this case, the discharge of the evaluation cell 1 is started by the charge and discharge circuit 2 (a step 121), and it is judged whether or not the cell voltage detected by the cell voltage detecting circuit 3 is near a predetermined voltage value $V_0$ of a discharge end voltage (for example, a value a little higher than the discharge end voltage)(a step 122), and the discharge is continued until the cell voltage becomes this predetermined voltage value $V_0$.

Then, when the voltage of the evaluation cell 1 becomes this predetermined voltage value $V_0$, the process is put in a pause by a first interval of time (for example, one hour)in a state that no charge and discharge are conducted (a step 123). After the first interval of time is over, measurement of the cell voltage is conducted (a step 124), and the voltage value measured here is denominated as V2 and is stored in the control unit 5.

Then, the process is put in a pause by a second interval of time (for example, two hours) in a state without charging and discharging (a step 125). Then, after the second interval of time is over, measurement of the cell voltage is conducted (a step 126), and the voltage value measured here is denominated as V3 and is stored in the control unit 5.

Then, in the control unit 5 the difference between the stored voltage values V2 and V3 is calculated. Specifically, V2−V3 is calculated (a step 127). Then, it is judged whether or not the voltage difference is smaller than a reference voltage difference set beforehand by a control program (a step 128). Here, if the difference is smaller than the reference voltage difference, the evaluation cell 1 is judged as a normal cell (a step 129). If necessary, the process shifts to the high rate charge mode and the evaluation cell is charged until its full voltage (or to a predetermined capacity) (a step 130).

When it is judged in the step 128 that the voltage difference exceeds the reference voltage difference, the evaluation cell 1 at this time is judged as a micro-short circuited cell (a step 131) and the display unit 8 is made to display in terms of letters that the evaluation cell 1 is an abnormal cell in which a micro-short circuit has occurred (a step 132).

Figure 6:
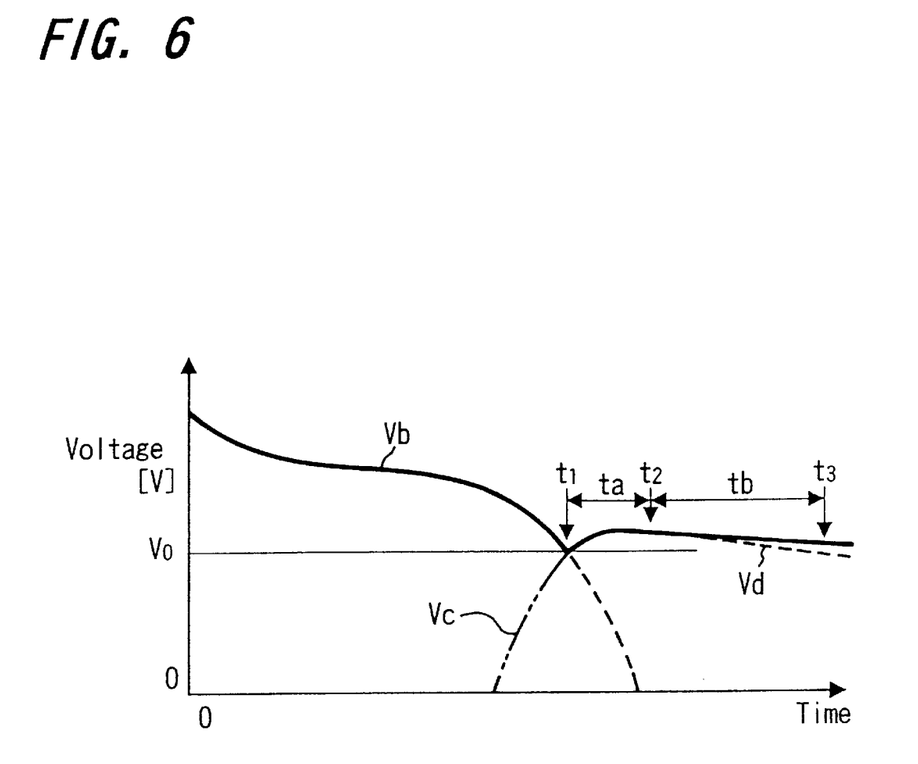
FIG. 6 is a characteristic graph showing an example of changes in voltage when detecting a micro-short circuit according to the embodiment.

FIG. 6 is a graph to indicate one example of changes in the cell voltage processed in this manner. The evaluation cell is discharged until its cell voltage Vb reaches a predetermined $V_0$, and at a timing $t_1$ where the cell voltage Vb arrives at the predetermined cell voltage $V_0$ the discharge by the charge and discharge circuit 2 is stopped. Besides, if the discharge is not stopped, the cell voltage nears 0v as shown by a broken line in FIG. 6.

When the discharge is stopped at the timing $t_1$, the cell voltage Vb rises somewhat from the predetermined voltage $V_0$ and after that is lowered gradually with time by a self-discharge of the cell. Here, at a timing $t_2$ after passage of a first time interval $t_a$ (for example, one hour) since the discharge is stopped at the timing $t_1$, the cell voltage V2 is measured. Then, at a timing $t_3$ after passage of a second time interval $t_b$ (for example, two hours) from the measurement of voltage V2, measurement of the cell voltage V3 is conducted. Then, by measuring the difference therebetween, the evaluation cell is judged as a normal cell in which no micro-short circuit has occurred.

For example, in a case of the micro-short circuited cell, lowering in the voltage from the timing $t_2$ to the timing $t_3$ becomes somewhat larger than the lowering by the self discharge like a characteristic Vd shown by a broken line in FIG. 6. The voltage difference of V2−V3 exceeds the reference voltage difference, so the evaluation cell is judged as an abnormal cell in which the micro-short circuit has occurred. The reason why it is possible to detect the micro-short circuited cell is because the lowering of the voltage value appears comparatively large as the cell voltage lowers near the discharge end voltage. For example, in a case of the voltage of sea cell which is nearly fully charged, it is impossible to detect the micro-short circuited cell within a time interval of this extent.

Figure 5:
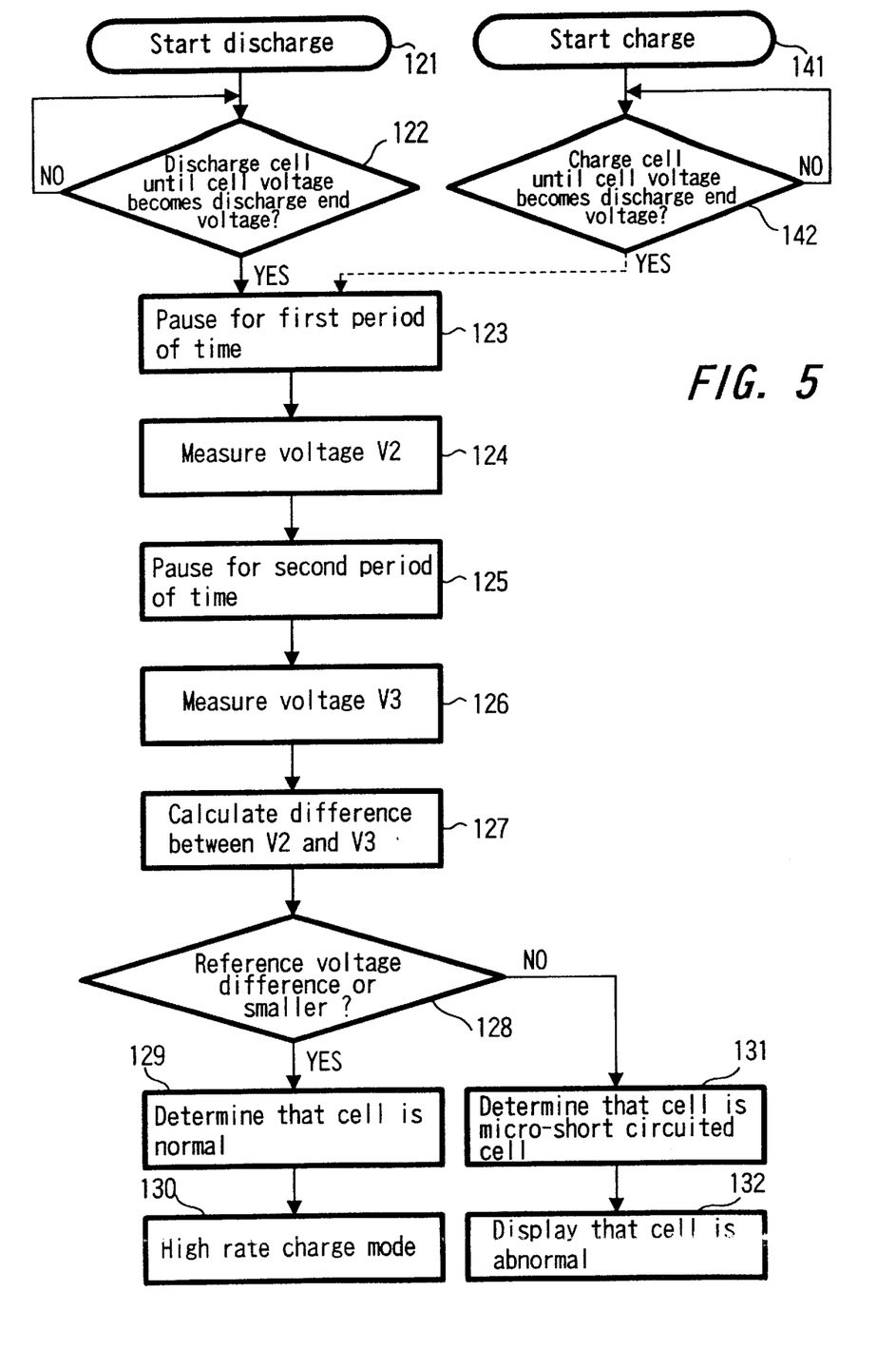
FIG. 5 is a flowchart showing a process of detecting a micro-short circuited cell according to the embodiment.

Moreover, the process from the step 121 to the step 123 in the flowchart of FIG. 5 is the process when the cell voltage is more than the predetermined voltage $V_0$ which is near the discharge end voltage, but when the cell voltage is lower than this voltage value $V_0$ owing to an unaccountable factor, it is recommended to conduct a process of detecting the micro-short circuit after raising the cell voltage to this voltage $V_0$ by charging the cell with a voltage $V_c$ indicated by a two-dot chain line in the characteristic graph in FIG. 6. That is, as a flow chart in FIG. 5 indicates, after starting a charge in a step 141, it is judged whether or not the cell is charged up to the voltage value $V_0$ near the discharge end voltage (a step 142), and when the cell voltage rises to the voltage value $V_0$, the process moves to the step 123 and shifts to a process of putting the cell to a pause for the first interval of time. And thereafter, the process of detecting the micro-short circuit is conducted according to the flowchart in FIG. 5 mentioned above. By the process in this manner, a detecting process of the micro-short circuit can be conducted for the evaluation cell with an extremely low cell voltage.

In the detecting process according to the flowchart in FIG. 5, while after detecting the voltage difference of V2–V3 it is judged whether or not there is an occurrence of the micro-short circuit based on the difference, it may also be possible to judge whether or not there is the occurrence of the micro-short circuit, for example, by comparing with the reference value the voltage value V3 which is obtained when the cell voltage is measured after the passage of three hours from the timing $t_0$ at which the charge and the discharge are stopped.

As described so far, by using the evaluation apparatus of this example for carrying out the evaluation of the secondary cell, it is possible to conduct the detection of the short circuited cell as well as the micro-short circuited cell and also it is possible to accurately charge the secondary cell until it is fully charged. In the case of this example, as the corresponding evaluation process conducted in the control unit 5 is carried out based on the control program stored in the control program memory unit 6, only by making the control program stored on the control program memory unit 6 the corresponding one, an evaluation apparatus can easily be made as an evaluating action which carried out the evaluation operation of this example. For example, in a case in which the control program is stored in a magnetic disc, it is possible to cope with the case only by replacing the magnetic disc with a corresponding disc, and hence the conventional evaluation apparatus can be changed into one capable of easily conducting the action of this embodiment.

Moreover, when a characteristic of a cell subjected to the evaluation is changed, for example, when evaluation of a cell having a different rated voltage and a different charge current value is conducted, it is possible to easily cope with changes in the kinds of cells to be evaluated only by substituting a control program in which a reference voltage value or the like is provided corresponding to the cell.

In the above mentioned embodiment, descriptions have been made for the case in which the charge and the discharge are conducted using the lithium ion cell as the secondary cell, but it goes without saying that the present invention can be applied to evaluating other secondary cells.

According to the cell evaluation method of the present invention it becomes possible to correctly evaluate a state of a cell by detecting and judging the voltage of the cell after passage of a predetermined time from the time when the charge is carried out for the cell or the charge of the cell is stopped.

In this case, by conducting the high rate charge for a predetermined time to a cell whose cell voltage is below the reference voltage and by continuing the high rate charge after judging that the cell is the normal cell when the cell voltage reaches the reference voltage, a judgement of the short-circuited cell can be correctly made, and when the cell is not the short-circuited one, a process to quickly charge the cell by the high rate charge is conducted.

Further, when the cell voltage reaches the reference voltage by the charge or when the cell voltage reaches the reference voltage by the discharge, the charge or the discharge is stopped, and after passage of a predetermined time from the stoppage, the cell voltage is detected and when the cell voltage is below a predetermined voltage, it is possible to judge the micro-short circuit in a short period of time by judging the cell is the one in which the micro-short circuit occurred.

Moreover, in the case of judging the micro-short circuit, the first detection of the cell voltage is conducted after passage of the first predetermined interval of time from the stoppage of the charge or the discharge, and the second detection of the cell voltage is conducted after passage of the second predetermined interval of time from the first detection of the cell voltage, and when the voltage difference between the cell voltage first detected and the cell voltage detected second is more than the predetermined voltage, by judging the cell as the one in which the micro-short circuit has occurred, it becomes possible to easily detect the micro-short circuit of the cell by judging the voltage difference.

When it is detected that the cell voltage becomes higher than the reference voltage which is nearer to a state of being fully charged by continuing the high rate charge, by stopping the charge to wait until the cell voltage is detected to be lower than the reference voltage nearer to being fully charged before the charge is resumed, the cell can be correctly charged in a state of being fully charged and a voltage capacity of the cell and so on can be correctly evaluated.

Moreover, according to the cell evaluation apparatus of the present invention, by detecting the cell voltage and judging the same after passage of the predetermined interval of time, the evaluation apparatus for correctly evaluating the state of the cell can be obtained In this case, as a reference voltage to be set in a reference voltage providing means a voltage corresponding to the discharge end voltage of a cell is presented and when it is judged that the cell voltage lowers below the predetermined reference voltage near the discharge end voltage in a comparing means, the high rate charge is conducted for a predetermined interval of time. When it is judged that in the comparing means the cell voltage exceeds the reference voltage by the high rate charge of the predetermined interval of time, a control to continue the high rate charge is carried out and then the judgement of the short circuited cell is correctly made, and when the cell is not the short circuited cell, a process for quickly charging the cell by the high rate charge is conducted and the evaluation of the cell in a state of an initial charge is aptly made.

Also, as the reference voltage to be set in the reference voltage setting means, a predetermined voltage near the discharge end voltage of the cell is presented and when it is judged that the cell voltage reaches a predetermined reference voltage near the discharge end voltage in the comparing means, the charge or the discharge is stopped. After passage of a predetermined interval of time from the stoppage, the cell voltage is detected and when the cell voltage detected is below the predetermined voltage, by judging that the cell is the one in which the micro-short circuit occurred, the detection of the micro-short circuited cell is correctly conducted in a comparatively short time.

Further, on an occasion of conducting the detection of the micro-short circuited cell, when passage of the first predetermined time from the stoppage of the charge or the discharge is judged, the cell voltage is detected and also when the passage of the second predetermined time is judged, the cell voltage is detected. The difference between both detected values of the cell is judged and if the difference is more than a predetermined voltage, the cell is judged as a cell in which a micro-short circuit occurred. Then, the detection of the micro-short circuited cell is easily and correctly conducted by the difference of the voltage.

Also, as the reference voltage to be set in the reference voltage setting means, a predetermined voltage near a voltage of a cell being fully charged is presented and when it is detected by comparison in the comparing means that the cell voltage becomes higher than the reference voltage by continuation of the high rate charge, the charge is stopped to standby. When it is detected that the cell voltage becomes lower than the reference voltage, a control to resume the charge is carried out so that the cell is charged until the cell is correctly and fully charged, and an evaluation apparatus capable of correctly evaluating a charge capacity or the like is obtained.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A cell evaluating method for evaluating characteristics of a secondary cell which can be repeatedly charged, comprising the steps of:
    detecting a cell voltage after a predetermined first charge operation for said secondary cell is started;
    proceeding to a second charge operation if said detected cell voltage is lower than a reference voltage; and
    determining a state of said secondary cell.

2. The cell evaluating method according to claim 1, wherein if said detected cell voltage is lower than the reference voltage after said second charge operation is carried out for a predetermined period of time, then it is determined that an internal short circuit occurs in said secondary cell.

3. The cell evaluating method according to claim 1, wherein if said detected cell voltage reaches the reference voltage after said second charge operation is carried out for a predetermined period of time, then it is determined that said second charge operation can be continued.

4. The cell evaluating method according to claim 3, wherein if it is determined that an internal short circuit occurs in said secondary cell, then a display unit indicates that said secondary cell is an abnormal cell.

5. The cell evaluating method according to claim 1, wherein said second charge operation charges said secondary cell with a current value larger than a predetermined current value.

6. A cell evaluating method for evaluating characteristics of a secondary cell which can be repeatedly charged, comprising the steps of:
    detecting a first cell voltage after a first predetermined period of time has passed since either one of a charge and a discharge of said secondary cell has stopped;
    detecting a second cell voltage after a second predetermined period of time has passed;
    calculating a difference between said first cell voltage and said second cell voltage; and
    determining that an internal short circuit occurs in said secondary cell if said difference exceeds a predetermined value.

7. The cell evaluating method according to claim 6, wherein if it is determined that said internal short circuit occurs, then a display unit indicates that said secondary cell is an abnormal cell.

8. The cell evaluating method according to claim 6, further comprising the steps of:
    stopping a second charge operation when it is detected that a cell voltage becomes higher than a reference voltage approximately equal to a full charge voltage while said second charge operation is being continued; and
    restarting said second charge operation when it is detected that said cell voltage becomes lower than said reference voltage approximately equal to the full charge voltage.

9. A cell evaluating apparatus for evaluating characteristics of a secondary cell which can be repeatedly charged, comprising:
    means for detecting a cell voltage after a predetermined first charge operation for said secondary cell is started;
    means for proceeding to a second charge operation different from said predetermined first charge operation if said detected cell voltage is lower than a reference voltage; and
    means for determining a state of said secondary cell.

10. The cell evaluating apparatus according to claim 9, wherein a means is provided such that if said detected cell voltage is lower than the reference voltage after said second charge operation is carried out for a predetermined period of time, then it is determined that an internal short circuit occurs in said secondary cell.

11. The cell evaluating apparatus according to claim 9, wherein there is provided a means such that if said detected cell voltage reaches the reference voltage after said second charge operation is carried out for a predetermined period of time, then it is determined that said second charge operation is to be continued.

12. The cell evaluating apparatus according to claim 11, wherein a display means is provided such that if it is determined that an internal short circuit occurs in said secondary cell, then said display means indicates that said secondary cell is an abnormal cell.

13. The cell evaluating apparatus according to claim 9, wherein said second charge operation charges said secondary cell with a current value larger than a predetermined current value.

14. A cell evaluating apparatus for evaluating characteristics of a secondary cell which can be repeatedly charged, comprising:
    means for detecting a first cell voltage after a first predetermined period of time has passed since either one of a charge and a discharge of said secondary cell;
    means for detecting a second cell voltage after a second predetermined period of time has passed; and
    means for calculating a difference between said first cell voltage and said second cell voltage and for determining if said difference exceeds a predetermined value indicating that an internal short circuit occurs in said secondary cell.

15. The cell evaluating apparatus according to claim 14, wherein a display means is provided such that if it is determined that said internal short circuit occurs in said secondary cell, then said display means indicates that said secondary cell is an abnormal cell.

16. The cell evaluating method according to claim 14, further comprising:

means for stopping a second charge operation when it is detected that a cell voltage becomes higher than a reference voltage approximately equal to a full charge voltage while said second charge operation is being continued; and means for restarting said second charge operation when it is detected that said cell voltage becomes lower than said reference voltage approximately equal to the full charge voltage.

* * * * *